United States Patent
Doris et al.

(10) Patent No.: US 9,502,292 B2
(45) Date of Patent: Nov. 22, 2016

(54) DUAL SHALLOW TRENCH ISOLATION LINER FOR PREVENTING ELECTRICAL SHORTS

(71) Applicants: INTERNATIONAL BUSINESS MACHINES CORPORATION, Armonk, NY (US); STMicroelectronics, Inc., Coppell, TX (US); COMMISSARIAT A L'ENERGIE ATOMIQUE ET AUX ENERGIES ALTERNATIVES, Paris (FR)

(72) Inventors: Bruce B. Doris, Slingerlands, NY (US); Shom Ponoth, Gaithersburg, MD (US); Prasanna Khare, Schenectady, NY (US); Qing Liu, Guilderland, NY (US); Nicolas Loubet, Guilderland, NY (US); Maud Vinet, Grenoble (FR)

(73) Assignees: INTERNATIONAL BUSINESS MACHINES CORPORATION, Armonk, NY (US); STMicroelectronics, Inc., Coppell, TX (US); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/856,949

(22) Filed: Sep. 17, 2015

(65) Prior Publication Data

US 2016/0013096 A1 Jan. 14, 2016

Related U.S. Application Data

(60) Division of application No. 14/096,515, filed on Dec. 4, 2013, now Pat. No. 9,171,757, which is a continuation of application No. 13/525,642, filed on Jun. 18, 2012, now Pat. No. 8,703,550.

(51) Int. Cl.
*H01L 21/336* (2006.01)
*H01L 21/76* (2006.01)
(Continued)

(52) U.S. Cl.
CPC ..... *H01L 21/76879* (2013.01); *H01L 21/0217* (2013.01); *H01L 21/76224* (2013.01);
(Continued)

(58) Field of Classification Search
CPC .......... H01L 21/76224; H01L 21/76227; H01L 21/76235; H01L 21/76237; H01L 29/66628; H01L 29/66636; H01L 21/76283; H01L 21/76286; H01L 21/76879; H01L 29/0847; H01L 29/0649; H01L 21/76877; H01L 21/76802; H01L 29/41783; H01L 29/66568; H01L 21/0217; H01L 21/76897; H01L 29/78609; H01L 29/0653; H01L 29/6656; H01L 29/66545
USPC ........ 438/296, 151, 300, 424, 149, 479, 517
See application file for complete search history.

(56) References Cited

U.S. PATENT DOCUMENTS 5,763,315 A * 6/1998 Benedict ........... H01L 21/76232
257/E21.545
6,140,208 A 10/2000 Agahi et al.
(Continued)

Primary Examiner — A. Sefer
Assistant Examiner — Dilinh Nguyen
(74) Attorney, Agent, or Firm — Scully, Scott, Murphy & Presser, P.C.; Steven J. Meyers, Esq.

(57) ABSTRACT

A shallow trench is formed to extend into a handle substrate of a semiconductor-on-insulator (SOI) layer. A dielectric liner stack of a dielectric metal oxide layer and a silicon nitride layer is formed in the shallow trench, followed by deposition of a shallow trench isolation fill portion. The dielectric liner stack is removed from above a top surface of a top semiconductor portion, followed by removal of a silicon nitride pad layer and an upper vertical portion of the dielectric metal oxide layer. A divot laterally surrounding a stack of a top semiconductor portion and a buried insulator portion is filled with a silicon nitride portion. Gate structures and source/drain structures are subsequently formed. The silicon nitride portion or the dielectric metal oxide layer functions as a stopping layer during formation of source/drain contact via holes, thereby preventing electrical shorts between source/drain contact via structures and the handle substrate.

18 Claims, 18 Drawing Sheets

(51) Int. Cl.
*H01L 21/20* (2006.01)
*H01L 21/425* (2006.01)
*H01L 21/768* (2006.01)
*H01L 21/762* (2006.01)
*H01L 29/06* (2006.01)
*H01L 29/786* (2006.01)
*H01L 21/02* (2006.01)
*H01L 29/08* (2006.01)
*H01L 29/417* (2006.01)
*H01L 29/66* (2006.01)

(52) U.S. Cl.
CPC ... *H01L21/76283* (2013.01); *H01L 21/76802* (2013.01); *H01L 21/76877* (2013.01); *H01L 21/76897* (2013.01); *H01L 29/0649* (2013.01); *H01L 29/0653* (2013.01); *H01L 29/0847* (2013.01); *H01L 29/41783* (2013.01); *H01L 29/66568* (2013.01); *H01L 29/78609* (2013.01); *H01L 29/6656* (2013.01); *H01L 29/66545* (2013.01); *H01L 29/66628* (2013.01)

(56) References Cited

U.S. PATENT DOCUMENTS

| | | |
|---|---|---|
| 6,657,267 B1 | 12/2003 | Xiang et al. |
| 6,657,276 B1 | 12/2003 | Karlsson et al. |
| 6,984,569 B2 | 1/2006 | Karlsson et al. |
| 8,703,550 B2 | 4/2014 | Doris et al. |
| 2005/0073022 A1 | 4/2005 | Karlsson et al. |
| 2008/0166856 A1* | 7/2008 | Parekh ............. H01L 27/10876 438/435 |
| 2012/0009760 A1 | 1/2012 | Kim |
| 2013/0175622 A1* | 7/2013 | Haran ................ H01L 21/84 257/347 |
| 2014/0099773 A1 | 4/2014 | Doris et al. |

* cited by examiner

DUAL SHALLOW TRENCH ISOLATION LINER FOR PREVENTING ELECTRICAL SHORTS

BACKGROUND

The present disclosure relates to semiconductor structures, and particularly to electrical isolation structures for ultra-thin semiconductor-on-insulator (UTSOI) devices and methods of manufacturing the same.

Ultra-thin semiconductor-on-insulator (UTSOI) devices refer to semiconductor devices formed on an ultra-thin semiconductor-on-insulator (UTSOI) substrate. A UTSOI substrate can be employed to form various semiconductor devices that derive performance advantage through the reduced thickness of the top semiconductor layer and/or the reduced thickness of the buried insulator layer compared with normal semiconductor-on-insulator (SOI) substrate.

For example, the reduction in the thickness of the top semiconductor layer provides full depletion of the channel, thereby enhancing the electrical control of the channel by the gate electrode and reducing the leakage current in a field effect transistor. Further, the reduction in the thickness of the buried insulator layer can enhance control by a back gate electrode in back-gated field effect transistors.

While UTSOI devices, and especially UTSOI field effect transistors (FETs), are promising candidates for advanced high performance devices, several manufacturing issues need to be resolved before UTSOI devices can be manufactured with high yield. One such issue is erosion of shallow trench isolation structures that are employed to provide lateral electrical isolation between adjacent devices. Specifically, etch steps and/or cleaning steps are repeatedly employed to recess various material layers and/or to clean surfaces before further processing. Shallow trench isolation structures can be etched during such etch steps and/or cleaning steps. Further, underlying portions of the buried insulator layer can be eroded to a degree that a hole is formed underneath a cavity formed by removal of the shallow trench isolation structure and a top surface of a handle substrate is exposed underneath the hole. For example, silicon oxide-based shallow trench isolation structures are susceptible to HF-based etches that can be employed to preclean semiconductor surfaces before epitaxy or formation of a gate dielectric.

Such holes in the buried insulator layer can cause severe yield problems during formation of contacts to source and drain regions. For example, contact via holes can straddle over a sidewall around a hole such that a top surface of the handle substrate, which is typically a semiconductor substrate, is physically exposed at the bottom of the hole in addition to physically exposed surfaces of a source region or a drain region located in or above the top semiconductor layer. A direct electrical short can be formed between the bottom semiconductor layer and the source region or the drain region by a conductive material that is deposited in the hole to form a contact via structure.

Thus, a method of ensuring sufficient electrical isolation between a bottom semiconductor layer of a UTSOI substrate and electrical nodes in a top semiconductor layer of the UTSOI substrate despite the erosion of shallow trench isolation structures and portions of a buried insulator layer during processing steps is needed to provide functional and reliable UTSOI devices.

BRIEF SUMMARY

A shallow trench is formed to extend into a handle substrate of a semiconductor-on-insulator (SOI) layer. A dielectric liner stack of a dielectric metal oxide layer and a silicon nitride layer is formed in the shallow trench, followed by deposition of a shallow trench isolation fill portion. The dielectric liner stack is removed from above a top surface of a top semiconductor layer, followed by removal of a silicon nitride pad layer and an upper vertical portion of the dielectric metal oxide layer. A divot laterally surrounding a stack of a top semiconductor portion and a buried insulator portion is filled with a silicon nitride portion. Gate structures and source/drain structures are subsequently formed. The silicon nitride portion or the dielectric metal oxide layer functions as a stopping layer during formation of source/drain contact via holes, thereby preventing electrical shorts between source/drain contact via structures and the handle substrate.

According to an aspect of the present disclosure, a method of forming a semiconductor structure is provided, which includes: etching a shallow trench laterally surrounding a stack of a top semiconductor portion, a buried insulator portion, and an upper portion of a handle substrate in a semiconductor-on-insulator (SOI) substrate; depositing a stack of a dielectric metal oxide liner and a silicon nitride liner in the shallow trench; filling the shallow trench with a shallow trench fill portion; depositing a contact-level dielectric layer over the top semiconductor portion and the shallow trench fill portion; and etching a contact via hole through the contact-level dielectric layer and a portion of the shallow trench fill portion employing at least one of the dielectric metal oxide liner and the silicon nitride liner as a stopping layer.

According to another aspect of the present disclosure, a method of forming a semiconductor structure is provided, which includes: etching a shallow trench laterally surrounding a stack of a top semiconductor portion, a buried insulator portion, and an upper portion of a handle substrate in a semiconductor-on-insulator (SOI) substrate; depositing a stack of a dielectric metal oxide liner and a silicon nitride liner in the shallow trench; filling the shallow trench with a shallow trench fill portion; and forming a semiconductor device on the top semiconductor portion.

According to yet another aspect of the present disclosure, a semiconductor structure is provided, which includes: a shallow trench laterally surrounding a stack of a top semiconductor portion, a buried insulator portion, and an upper portion of a handle substrate and located in a semiconductor-on-insulator (SOI) substrate; a stack of a dielectric metal oxide liner and a silicon nitride liner located at a bottom of the shallow trench; a shallow trench fill portion located within the shallow trench and vertically contacting the stack; a contact-level dielectric layer located over the top semiconductor portion and the shallow trench fill portion; and a contact via structure extending through the contact-level dielectric layer and into a portion of the shallow trench and in contact with a vertical sidewall of the shallow trench fill portion and one of the dielectric metal oxide liner and the silicon nitride liner.

According to yet another aspect of the present disclosure, a semiconductor structure is provided, which includes: a shallow trench laterally surrounding a stack of a top semiconductor portion, a buried insulator portion, and an upper portion of a handle substrate and located in a semiconductor-on-insulator (SOI) substrate; and a stack of a dielectric metal oxide liner and a silicon nitride liner located at a bottom of the shallow trench, wherein a topmost portion of the dielectric metal oxide liner laterally surrounds a lower portion of the buried insulator portion, is in contact with a sidewall of the lower portion of the buried insulator portion, and is located below a plane of a top surface of the buried insulator portion.

DETAILED DESCRIPTION

Figure 1:
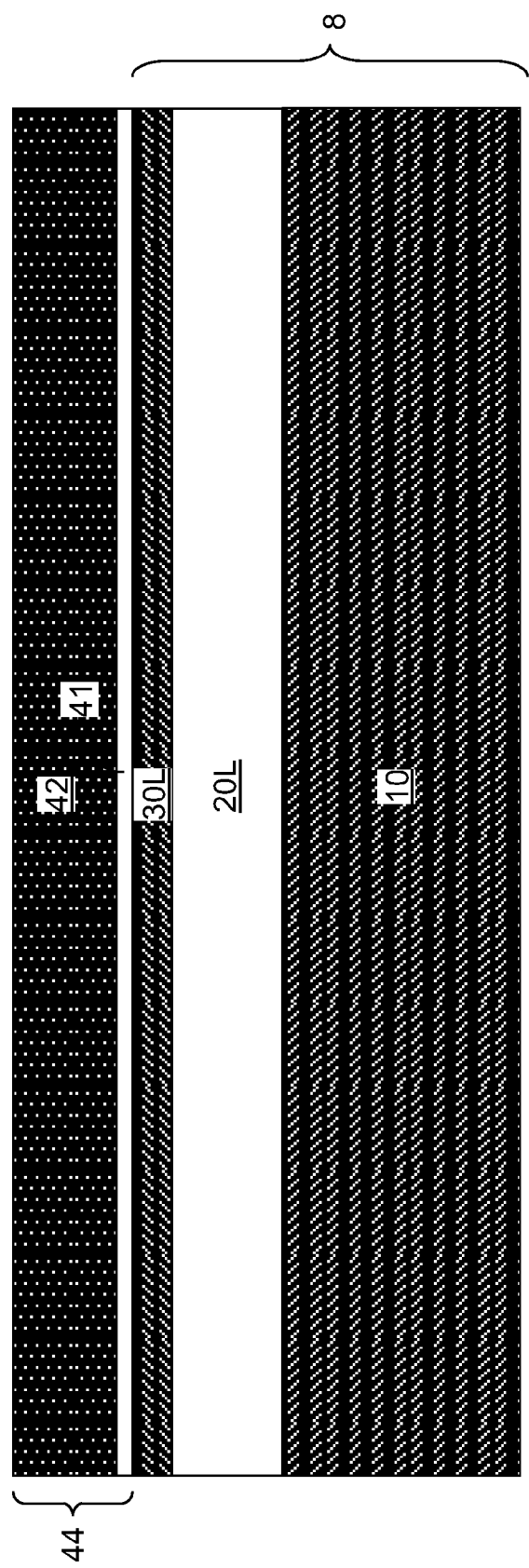
FIG. 1 is a vertical cross-sectional view of a first exemplary semiconductor structure after formation of first and second pad dielectric layers on a semiconductor-on-insulator (SOI) substrate according to a first embodiment of the present disclosure.

As stated above, the present disclosure relates to electrical isolation structures for ultra-thin semiconductor-on-insulator (UTSOI) devices and methods of manufacturing the same, which are now described in detail with accompanying figures. Like and corresponding elements mentioned herein and illustrated in the drawings are referred to by like reference numerals. The drawings are not necessarily drawn to scale.

As used herein, a "shallow trench" refers to a trench having a depth less than 2 microns.

Referring to FIG. 1, a first exemplary semiconductor structure according to a first embodiment of the present disclosure includes a semiconductor-on-insulator (SOI) substrate 8. The SOI substrate 8 includes a vertical stack of a handle substrate 10, a buried insulator layer 20L, and a top semiconductor layer 30L.

The handle substrate 10 can include a semiconductor material, a dielectric material, a conductive material, or a combination thereof. For example, the handle substrate 10 can be a single crystalline silicon substrate. The buried insulator layer 20L includes a dielectric material such as silicon oxide, silicon nitride, silicon oxynitride, or a combination thereof. The top semiconductor layer 30L includes a semiconductor material such as silicon, germanium, a silicon-germanium alloy, a III-V compound semiconductor, a II-VI compound semiconductor, any other semiconductor material known in the art, or combinations thereof. The semiconductor material in the top semiconductor layer 30L can be single crystalline.

In one embodiment, the semiconductor SOI substrate 8 can be an ultra-thin semiconductor-on-insulator (UTSOI) substrate. The top semiconductor layer 30L of a typical UTSOI substrate 8 is also referred to as an ultra-thin semiconductor-on-insulator (UTSOI) layer, and has a thickness from 3 nm to 15 nm. The buried insulator layer underneath the top semiconductor layer 30L of a UTSOI substrate can have a thickness from 10 nm to 50 nm.

At least one dielectric pad layer 44 is deposited on the top surface of the top semiconductor layer 30L. In one embodiment, the at least one dielectric pad layer 44 includes a vertical stack, from bottom to top, of a first dielectric pad layer 41 and a second dielectric pad layer 42.

In one embodiment, the first dielectric pad layer 41 can be a silicon oxide layer or a silicon oxynitride layer. The first dielectric pad layer 41 can be formed, for example, by thermal and/or plasma conversion of a top portion of the top semiconductor layer 30L into a dielectric material such as silicon oxide or silicon oxynitride, or can be formed by deposition of silicon oxide or silicon oxynitride by chemical vapor deposition (CVD) or atomic layer deposition (ALD). The thickness of the first dielectric pad layer 41 can be from 1 nm to 10 nm, although lesser and greater thicknesses can also be employed.

In one embodiment, the second dielectric pad layer 42 can be a silicon nitride layer. The second dielectric pad layer 42 can be formed, for example, by chemical vapor deposition (CVD) of silicon nitride. The thickness of the second dielectric pad layer 42 can be from 3 nm to 60 nm, although lesser and greater thicknesses can also be employed.

Figure 2:
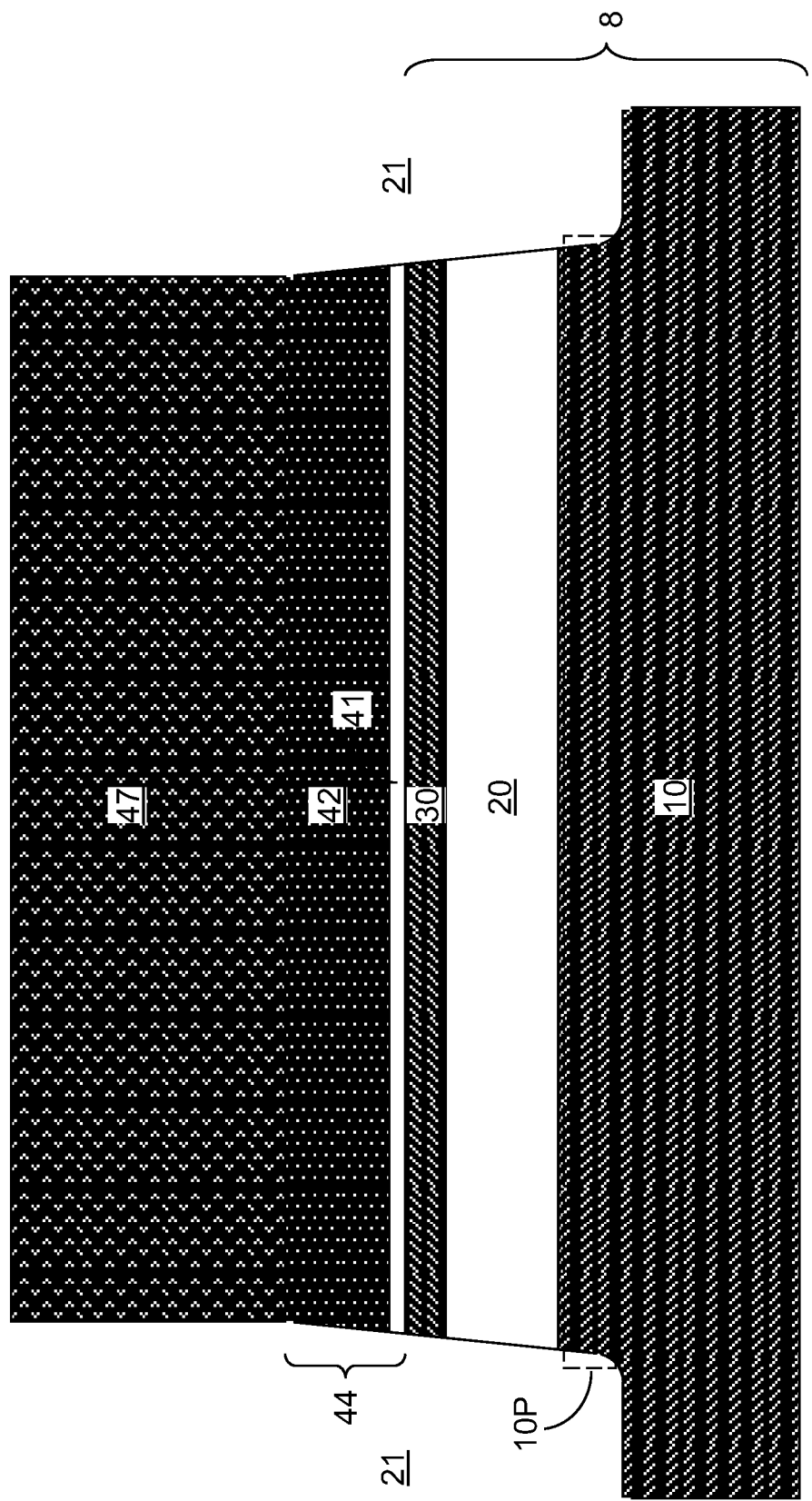
FIG. 2 is a vertical cross-sectional view of the first exemplary semiconductor structure after formation of a shallow trench laterally surrounding a top semiconductor portion according to the first embodiment of the present disclosure.

Referring to FIG. 2, a photoresist layer 47 is applied over the at least one dielectric pad layer 44, and is lithographically patterned to block a contiguous region of the at least one dielectric pad layer 44 surrounded by a contiguous opening. The pattern in the photoresist layer 47 is transferred through the at least one dielectric pad layer 44, the top semiconductor layer 30L, the buried insulator layer 20L, and an upper portion 10P of the handle substrate 10 by at least one etch that employs the photoresist layer 47 as an etch mask. The at least one etch can be at least one anisotropic etch such as at least one reactive ion etch. A shallow trench 21 is etched in the stack of the SOI substrate 8 and the at least one dielectric pad layer 44. The shallow trench vertically extends from the top surface of the at least one dielectric pad layer 44 to a depth below the interface between the handles substrate 10 and the buried insulator layer 20L.

The remaining portion of the top semiconductor layer 30L that is laterally surrounded by the shallow trench 21 is herein referred to as a top semiconductor portion 30. The remaining portion of the buried insulator layer 20L that is laterally surrounded by the shallow trench 21 is herein referred to as a buried insulator portion 20. The shallow trench 21 laterally surrounds a vertical stack, from bottom to top, of the upper portion 10P of the handle substrate 10, the buried insulator portion 20, the top semiconductor portion 30, a portion of the first dielectric pad layer 41, and a portion of the second dielectric pad layer 42. The photoresist layer 47 is subsequently removed, for example, by ashing.

Figure 3:
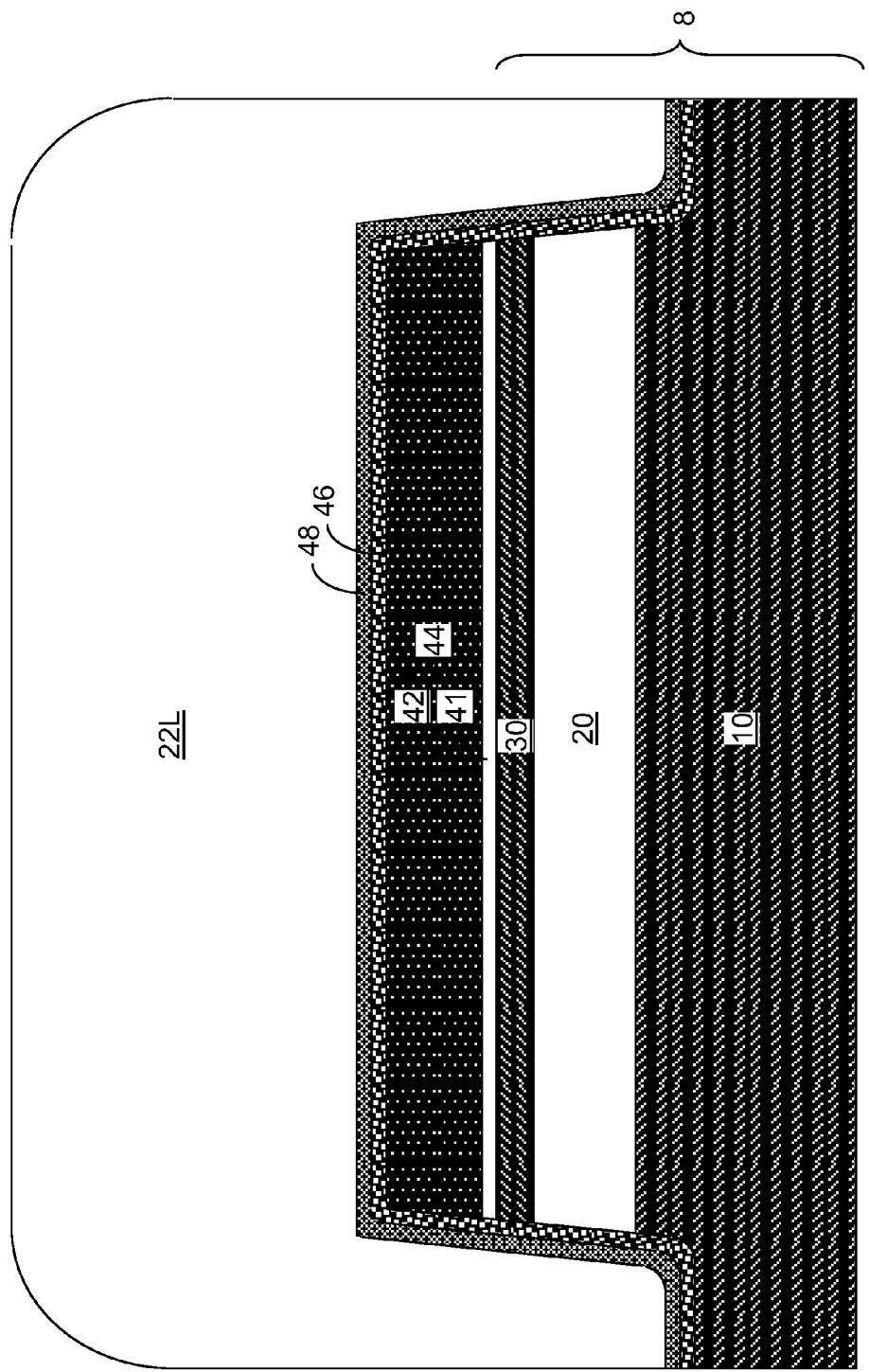
FIG. 3 is a vertical cross-sectional view of the first exemplary semiconductor structure after deposition of a dielectric metal oxide liner, a silicon nitride liner, and a shallow trench fill dielectric material layer according to the first embodiment of the present disclosure.

Referring to FIG. 3, a stack of a dielectric metal oxide liner 46 and a silicon nitride liner 48 is deposited. The dielectric metal oxide liner 46 includes a dielectric metal oxide material, i.e., a dielectric compound including at least one metal and oxygen. The dielectric metal oxide material can optionally include nitrogen, carbon, fluorine, and/or chlorine. Further, the dielectric metal oxide material can optionally include silicon. For example, the dielectric metal oxide material can be a material known in the art as high-k gate dielectric materials having a dielectric constant greater than the dielectric constant of silicon nitride, i.e., 7.9. Dielectric metal oxide materials can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. The dielectric metal oxide liner 46 can be deposited as a contiguous layer on the entirety of the physically exposed surfaces of the at least one dielectric pad layer 44, the handle substrate 10, the buried insulator portion 20, and the top semiconductor portion 30. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the dielectric metal oxide liner 46 can be from 1 nm to 30 nm, and preferably from 0.6 nm to 2 nm, although lesser and greater thicknesses can also be employed.

The silicon nitride liner 48 is deposited as a contiguous layer on the entirety of the top surfaces of the dielectric metal oxide liner 46. The silicon nitride liner 48 can be deposited, for example, by chemical vapor deposition (CVD), molecular layer deposition (MLD), or a combination thereof. The silicon nitride liner 48 can be stoichiometric (i.e., have a composition of $Si_3N_4$) or non-stoichiometric. The thickness of the silicon nitride liner 48 can be from 1 nm to 30 nm, although lesser and greater thicknesses can also be employed.

A shallow trench fill dielectric material layer 22L is sequentially deposited. The shallow trench fill dielectric material layer 22L can include silicon oxide, and can be deposited, for example, by chemical vapor deposition (CVD). The thickness of the shallow trench fill dielectric material layer 22L, as measured over a horizontal portion such as above the at least one dielectric pad layer 44, can be greater than the depth of the shallow trench 21 (See FIG. 2), as measured between the topmost surface of the at least one dielectric pad layer 44 and the bottommost surface of the shallow trench 21. The shallow trench fill dielectric material layer 22L can fill the entirety of the shallow trench 21 below the topmost surface of the silicon nitride liner 48.

Figure 4:
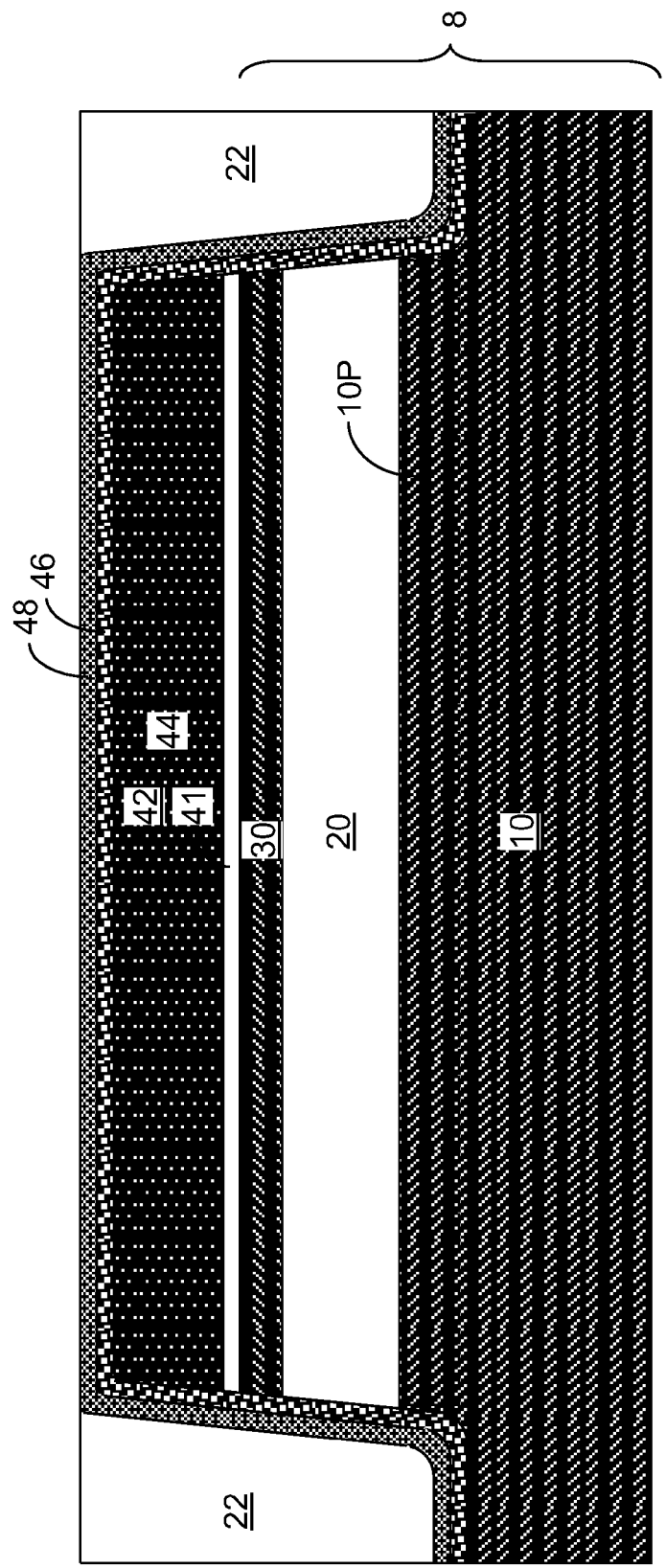
FIG. 4 is a vertical cross-sectional view of the first exemplary semiconductor structure after planarization of the shallow trench fill dielectric material layer according to the first embodiment of the present disclosure.

Referring to FIG. 4, the portion of the shallow trench fill dielectric material layer 22L located above the horizontal plane of the topmost surface of the silicon nitride liner 48 is planarized, for example, by chemical mechanical planarization (CMP), a recess etch, or a combination thereof. A remaining portion of the shallow trench fill dielectric material layer 22L after planarization includes a shallow trench fill portion 22. The shallow trench fill portion 22 contiguously and laterally surrounds the stack of the upper portion 10P of the handle substrate 10, the buried insulator portion 20, the top semiconductor portion 30, the first dielectric pad layer 41, and the second dielectric pad layer 42. The shallow trench fill portion 22 is laterally spaced from the stack of the upper portion 10P of the handle substrate 10, the buried insulator portion 20, the top semiconductor portion 30, the first dielectric pad layer 41, and the second dielectric pad layer 42 by substantially vertical portions of the stack of the dielectric metal oxide liner 46 and the silicon nitride liner 48. The combination of deposition of the shallow trench fill dielectric material layer 22L and subsequent planarization of the shallow trench fill dielectric material layer 22L forms the shallow trench fill portion 22, which fills the shallow trench 21 (See FIG. 2).

Figure 5:
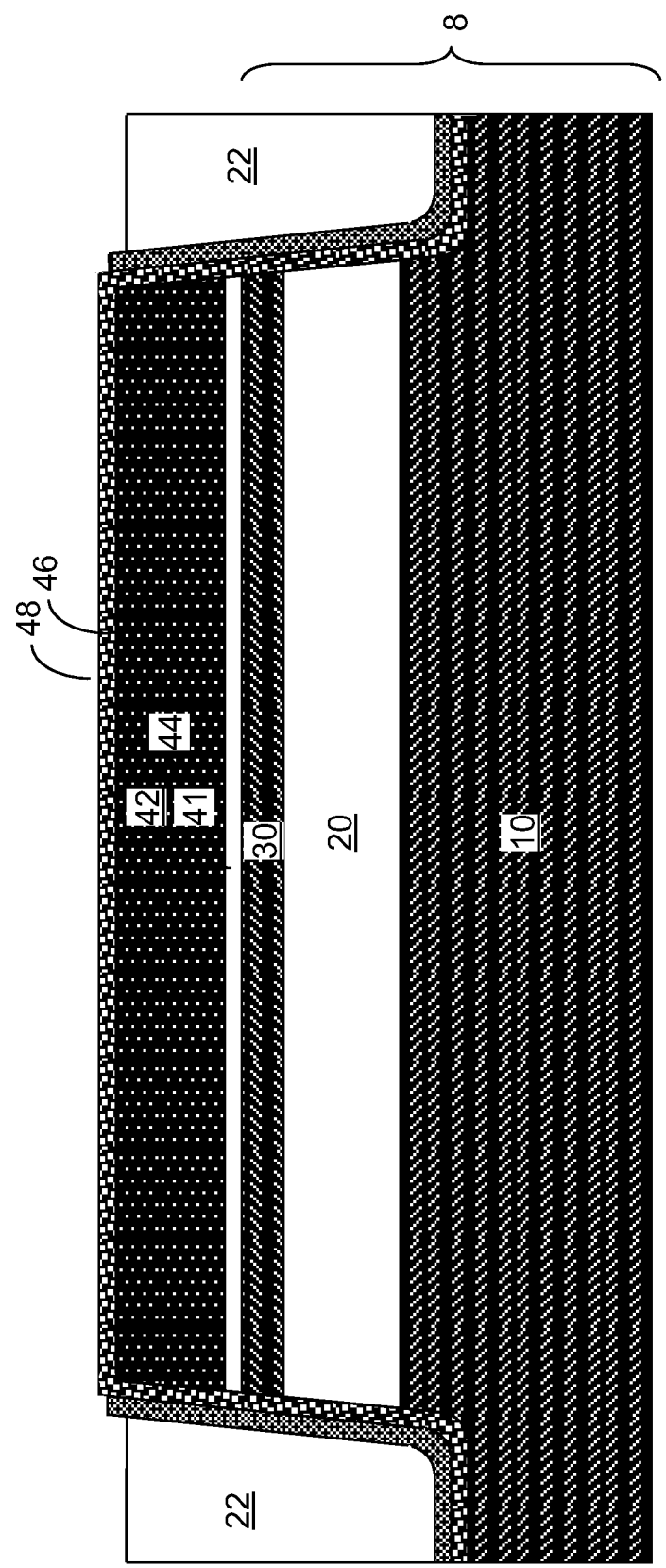
FIG. 5 is a vertical cross-sectional view of the first exemplary semiconductor structure after removal of a physically exposed portion of the silicon nitride liner from above the top surface of the top semiconductor portion according to the first embodiment of the present disclosure.

Referring to FIG. 5, a physically exposed portion of the silicon nitride liner 48, i.e., the portion of the silicon nitride liner 48 located above the top surface of the at least one dielectric pad layer 44, is removed from above the top surface of the top semiconductor portion 30, for example, by a wet etch employing hot phosphoric acid or by a dry etch. The shallow trench fill portion 22 can be recessed during the removal of the physically exposed portion of the silicon nitride liner 48.

Figure 6:
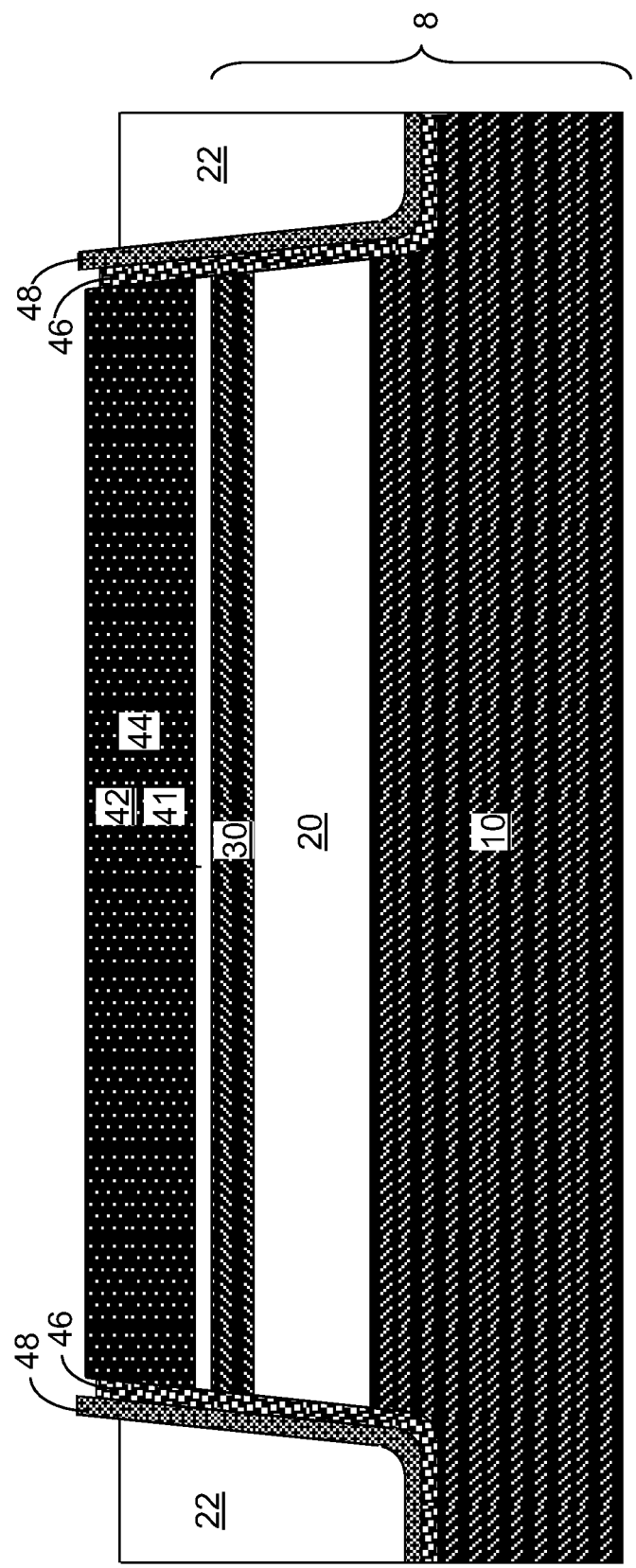
FIG. 6 is a vertical cross-sectional view of the first exemplary semiconductor structure after removal of physically exposed portions of the dielectric metal oxide liner from above the top surface of the top semiconductor portion according to the first embodiment of the present disclosure.

Referring to FIG. 6, a physically exposed portion of the dielectric metal oxide liner 46, i.e., the portion of the dielectric metal oxide liner 46 located above the top surface of the at least one dielectric pad layer 44, is removed from above the top surface of the top semiconductor portion 30, for example, by a wet etch or by a dry etch. The chemistry for etching the material of the dielectric metal oxide liner 46 depends on the composition of the dielectric metal oxide liner 46, and any chemistry for etching the material of the dielectric metal oxide liner 46 as known in the art can be employed. The shallow trench fill portion 22 may further be recessed during the removal of the physically exposed portion of the dielectric metal oxide liner 46. Thus, the stack of the dielectric metal oxide liner 46 and the silicon nitride liner 48 is removed from above the top semiconductor portion 30.

Figure 7:
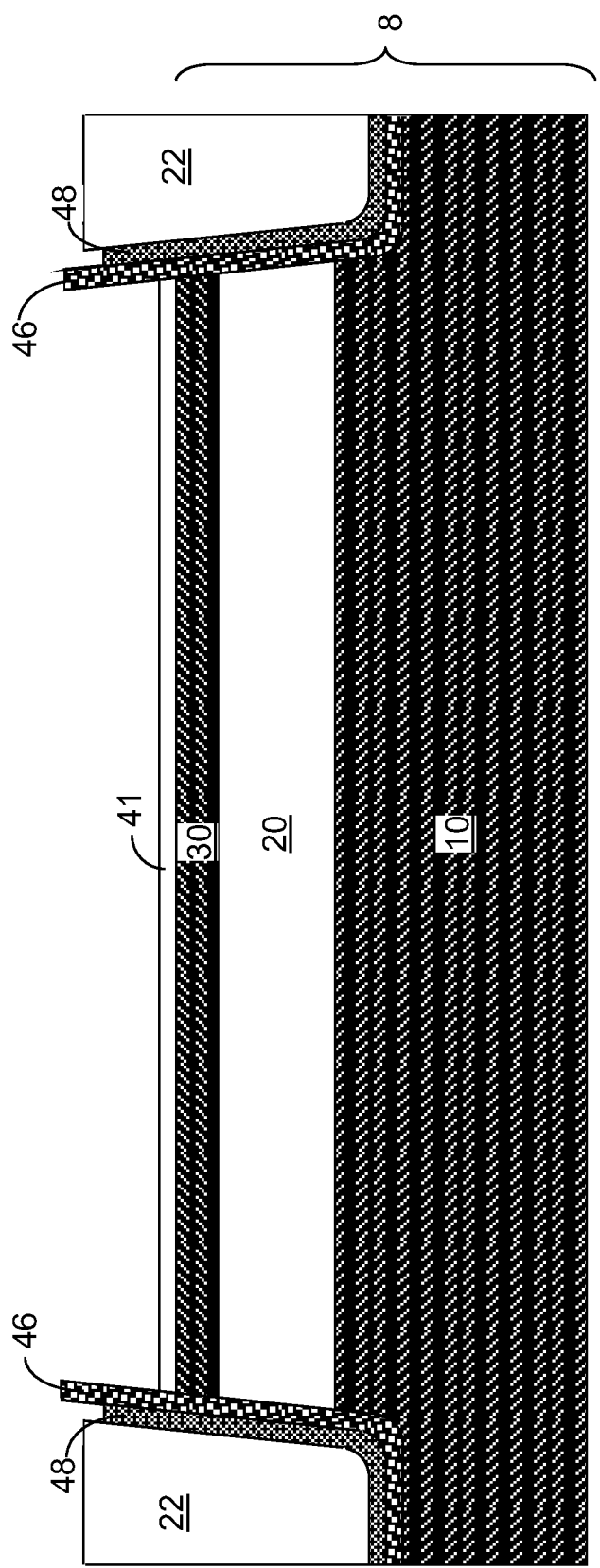
FIG. 7 is a vertical cross-sectional view of the first exemplary semiconductor structure after removal of the second pad dielectric layer according to the first embodiment of the present disclosure.

Referring to FIG. 7, the second pad dielectric layer 42 is removed, for example, by a wet etch or a dry etch. For example, if the second pad dielectric layer 42 includes silicon nitride, a wet etch employing hot phosphoric acid can be employed to remove the second pad dielectric layer 42. The silicon nitride liner 48 can be recessed below the top surface of the shallow trench fill portion 22 during the removal of the second pad dielectric layer 42.

Figure 8:
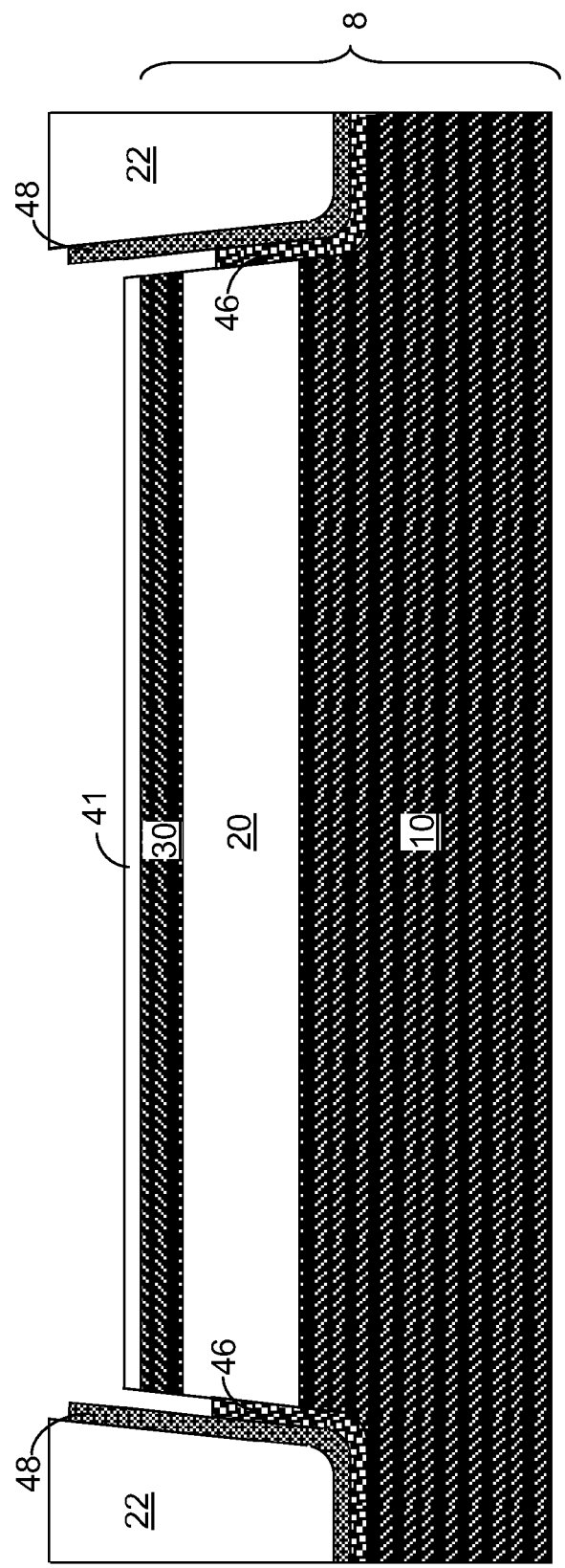
FIG. 8 is a vertical cross-sectional view of the first exemplary semiconductor structure after recessing of the dielectric metal oxide liner according to the first embodiment of the present disclosure.

Referring to FIG. 8, the dielectric metal oxide liner 46 is recessed to a depth between the top surface of the buried insulator portion 20 and the bottom surface of the buried insulator portion 20. The recessing of the dielectric metal oxide liner 46 can be performed, for example, by employing a wet etch having a chemistry that removes the material of the dielectric metal oxide liner 46 selective to the silicon nitride liner 48 and the semiconductor material of the top semiconductor portion 30. Any wet etch chemistry known in the art can be employed for the wet etch provided that the etch chemistry is selective to silicon nitride liner 48 and the semiconductor material of the top semiconductor portion 30. In one embodiment, the etch chemistry is selective to silicon oxide. A divot laterally surrounding the top semiconductor portion 30 and extending below the interface between the top semiconductor portion 30 and the buried insulator portion 20 is formed by the recessing.

Figure 9:
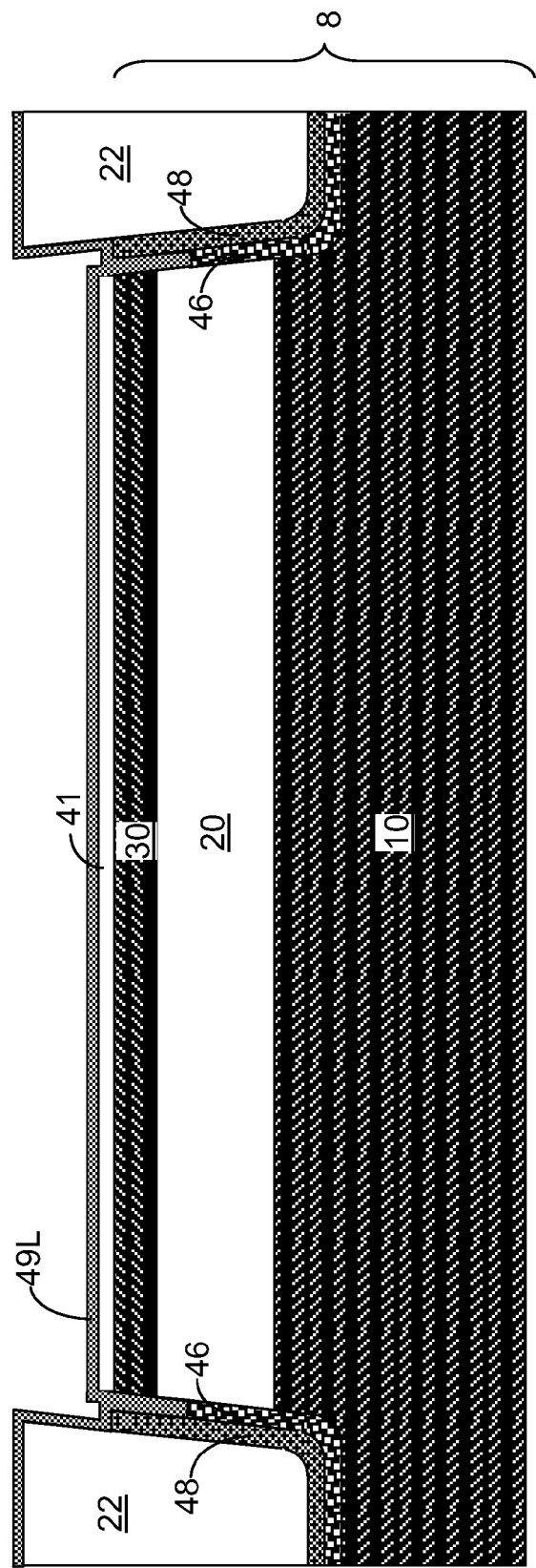
FIG. 9 is a vertical cross-sectional view of the first exemplary semiconductor structure after deposition of a conformal dielectric material layer according to the first embodiment of the present disclosure.

Referring to FIG. 9, a conformal dielectric material layer 49L is deposited by a conformal deposition process such as chemical vapor deposition (CVD) or atomic layer deposition (ALD). The conformal dielectric material layer 49L is contiguously deposited within the divot and above the top semiconductor portion 30 and the shallow trench fill portion 22. The divot is filled with the dielectric material of the conformal dielectric material layer 49L. The conformal dielectric material layer 49L contacts upper portions of inner sidewall surfaces (i.e., sidewall surfaces that are proximal to the top semiconductor portion 30) of the silicon nitride liner 48 and the topmost surface of the silicon nitride liner 48.

In one embodiment, the conformal dielectric material layer 49L can be a silicon nitride layer. The composition of the silicon nitride layer can be stoichiometric (i.e., have a composition of $Si_3N_4$), or non-stoichiometric. Further, the composition of the silicon nitride layer can be the same as, or different from, the composition of the silicon nitride liner 48.

Figure 10:
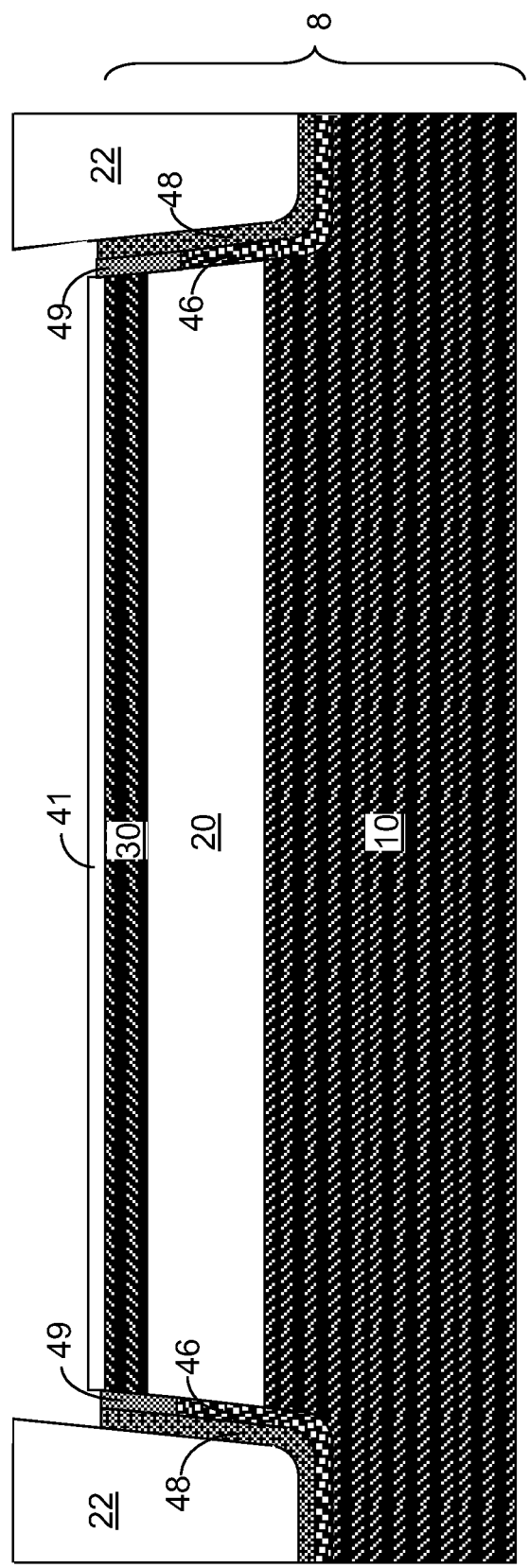
FIG. 10 is a vertical cross-sectional view of the first exemplary semiconductor structure after removal of the conformal dielectric material layer from above a divot in the SOI substrate according to the first embodiment of the present disclosure.

Referring to FIG. 10, an isotropic etch is performed to remove portions of the conformal dielectric material layer 49L above the divot around the top semiconductor portion 30. The isotropic etch can be a wet etch or a dry etch. For example, the isotropic etch can be a wet etch employing hot phosphoric acid. The remaining portion of the conformal dielectric material layer 49L within the divot constitutes a dielectric material portion 49 that laterally surrounds the top semiconductor portion 30 and an upper portion of the buried insulator portion 20. Thus, the divot is filled with the dielectric material portion 49.

The dielectric material portion 49 laterally contacts the silicon nitride liner 48 and the entirety of the sidewall of the top semiconductor portion 30. Further, the dielectric material portion vertically contacts the dielectric metal oxide liner 46. The topmost portion of the dielectric metal oxide liner 46 is located between a first horizontal plane of the top surface of the buried insulator portion 20 and a second horizontal plane of the bottom surface of the buried insulator portion 20.

Figure 11:
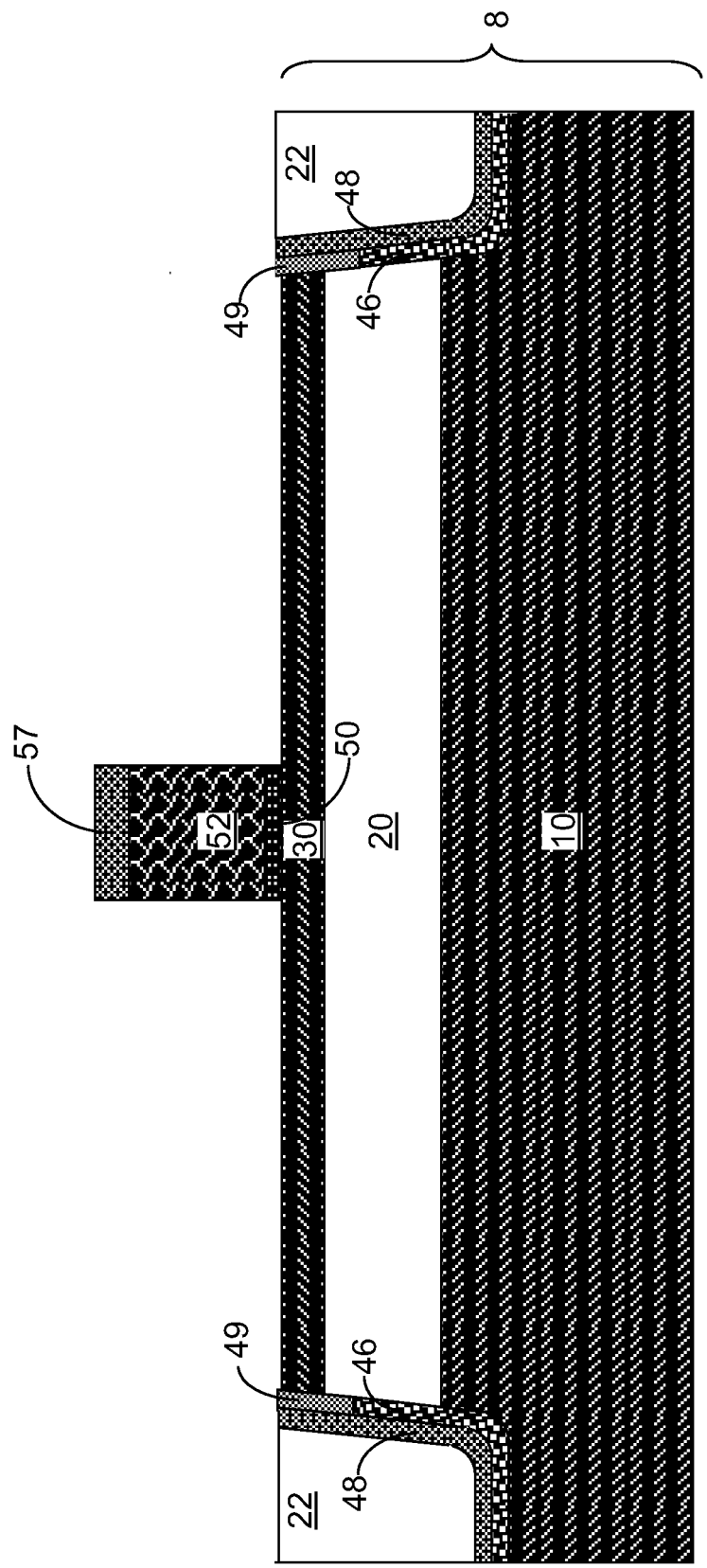
FIG. 11 is a vertical cross-sectional view of the first exemplary semiconductor structure after recessing of a shallow trench fill portion and removal of the first pad dielectric layer and formation of a gate stack according to the first embodiment of the present disclosure.

Referring to FIG. 11, the first pad dielectric layer 41 is removed selective to the top semiconductor portion 30. If the first pad dielectric layer 41 includes silicon oxide, the wet etch can employ dilute hydrofluoric acid (HF). The top portion of the shallow trench fill portion 22 can be recessed during the removal of the first pad dielectric layer 41 or in a different recess etch so that the top surface of the shallow trench fill portion 22 becomes substantially coplanar with the top surface of the top semiconductor portion 30. As used herein, a first surface is substantially coplanar with a second surface if the difference in height between the first surface and the second surface is limited by inherent limitations of processing techniques intended to make the first and second surfaces coplanar.

At least one semiconductor device can be formed on the top semiconductor portion. The at least one semiconductor device can include, for example, a field effect transistor, a junction transistor, a diode, a resistor, a capacitor, an inductor, an optical device, or any other semiconductor device known in the art. For example, the at least one semiconductor device can include a field effect transistor. In this exemplary case, a gate stack including a gate dielectric 50, a gate electrode 52, and a gate cap dielectric 57 can be formed by deposition of a stack of gate layers including a gate dielectric layer, a gate electrode layer, and a gate cap dielectric layer, and subsequent patterning of the stack of the gate layers. The gate dielectric 50 can include any gate dielectric material known in the art including, but not limited to, silicon-oxide-based gate dielectric materials and dielectric metal oxide materials. If a dielectric metal oxide material is employed as the entirety of, or as a part of, the gate dielectric 50, the dielectric metal oxide material within the gate dielectric 50 can have the same composition as, or a different composition from, the dielectric metal oxide material of the dielectric metal oxide liner 46. Further, the dielectric metal oxide material within the gate dielectric 50 can have the same thickness as, or a different thickness from, the dielectric metal oxide material of the dielectric metal oxide liner 46. The conductive material of the gate electrode 52 can be any conductive material known in the art that can be employed for a gate electrode. The dielectric material of the gate cap dielectric 57 can be, for example, silicon oxide, silicon nitride, silicon oxynitride, or any combination thereof.

Figure 12:
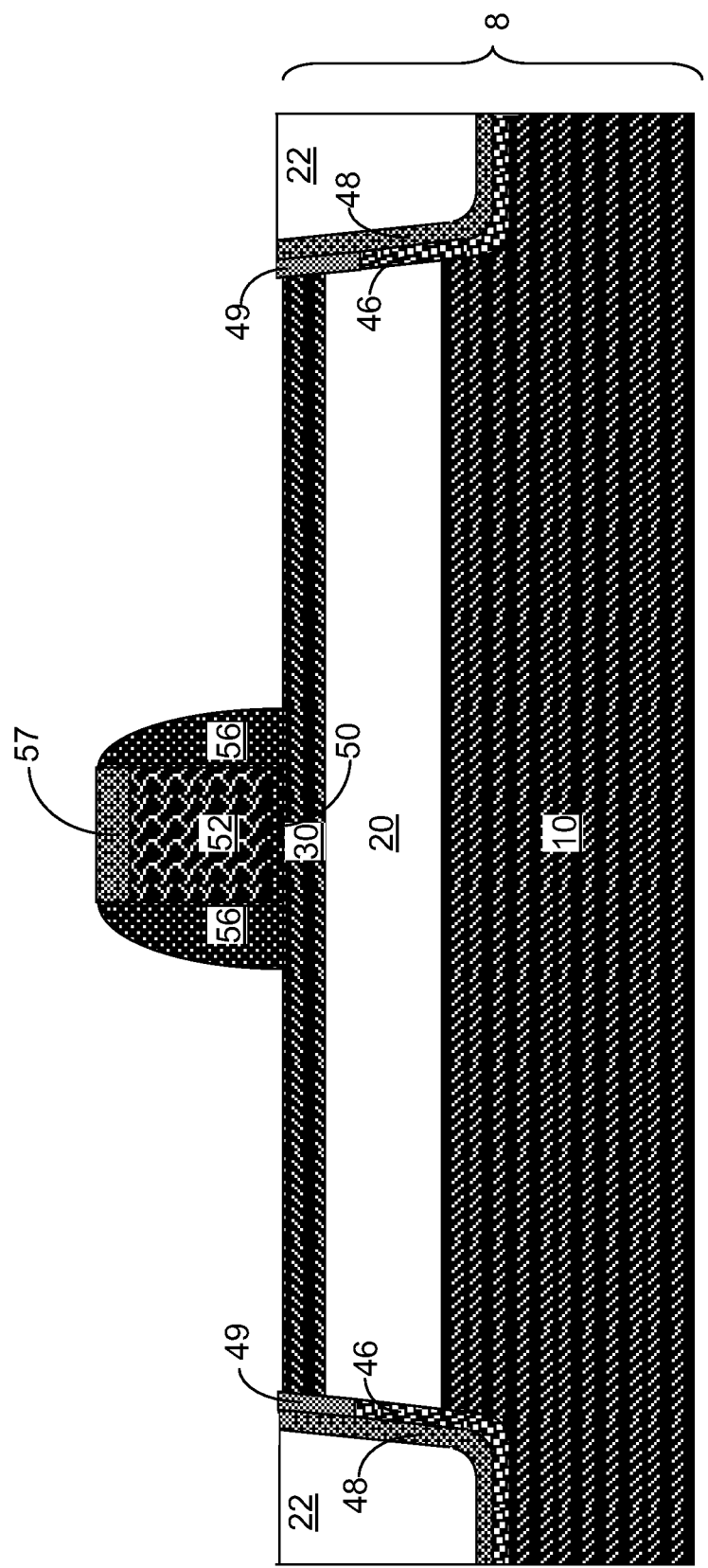
FIG. 12 is a vertical cross-sectional view of the first exemplary semiconductor structure after formation of a gate spacer and optional implantation into source/drain regions according to the first embodiment of the present disclosure.

Referring to FIG. 12, a gate spacer 56 is formed around the gate stack (50, 52, 57), for example, by deposition of at least one conformal dielectric layer and removal of horizontal portions of the at least one conformal dielectric layer by an anisotropic etch such as a reactive ion etch. The remaining vertical portions of the at least one conformal dielectric layer constitutes the gate spacer 56. Optionally, p-type dopant ions or n-type dopant ions can be implanted into regions of the top semiconductor portion 30 that do not underlie the assembly of the gate stack (50, 52, 57) and the gate spacer 56. In this case, source/drain regions (not expressly shown) can be formed within the top semiconductor portion 30.

Figure 13:
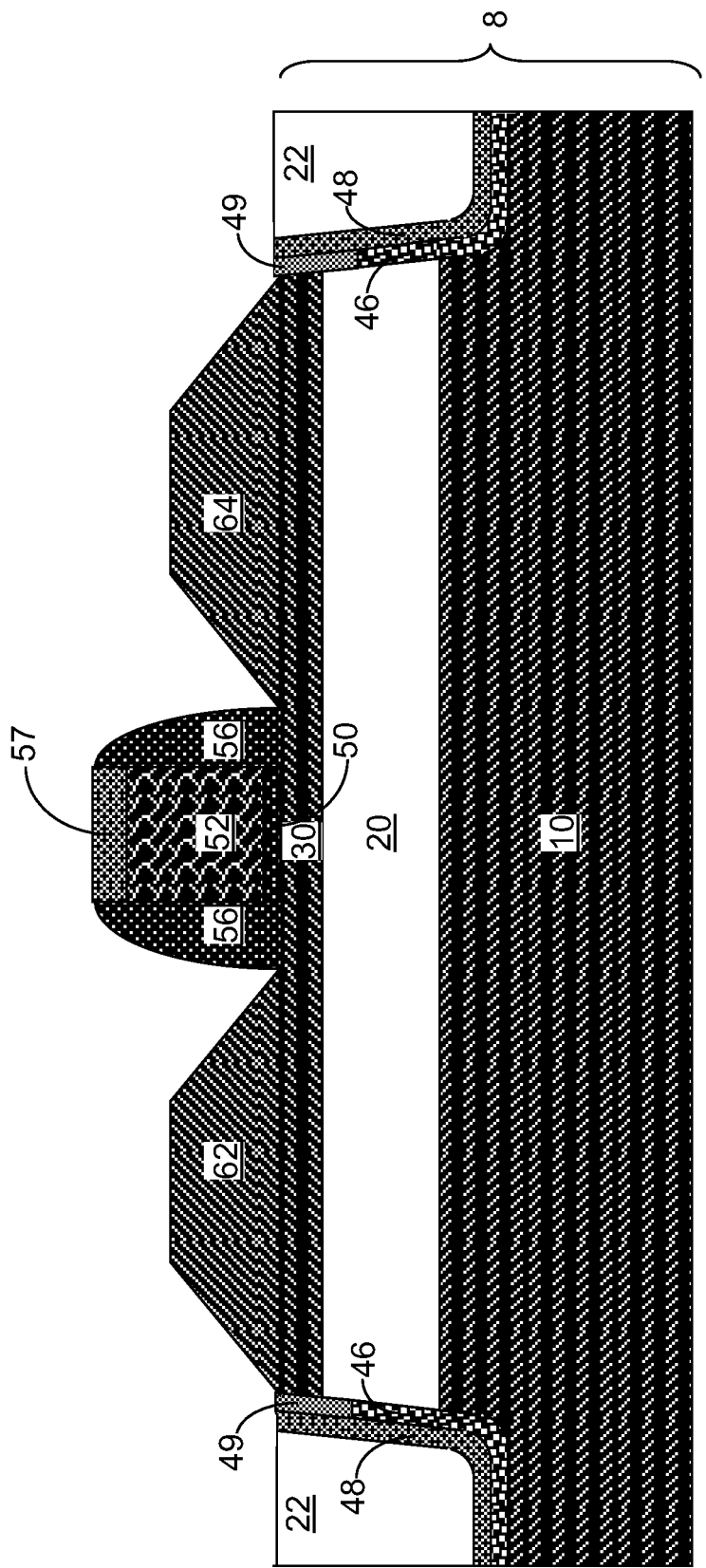
FIG. 13 is a vertical cross-sectional view of the first exemplary semiconductor structure after formation of raised source/drain regions by selective epitaxy according to the first embodiment of the present disclosure.

Referring to FIG. 13, a raised source region 62 and a raised drain region 64 are formed by selective deposition of a semiconductor material. For example, a preclean process and a subsequent selective deposition process can be performed to deposit a semiconductor material on semiconductor surfaces, while not depositing the semiconductor material on any dielectric surface. The preclean process can be, for example, a hydrofluoric acid (HF) wet etch, which removes silicon oxide from top surfaces of the top semiconductor portion 30. The HF wet etch can accompany a collateral etch of the physically exposed portions of the shallow trench fill portion 22 if the shallow trench fill portion 22 includes silicon oxide.

During the selective deposition process, the semiconductor material is deposited on semiconductor surfaces of the top semiconductor portion 30 within the top semiconductor layer 30L, and is not deposited on dielectric surfaces. The selective deposition process can be, for example, a selective epitaxy process in which a single crystalline semiconductor material is deposited on single crystalline semiconductor surfaces of the top semiconductor portion 30.

For example, the top semiconductor portion 30 can include a single crystalline semiconductor material such as single crystalline silicon, a single crystalline silicon-germanium alloy, a single crystalline silicon-carbon alloy, a single crystalline III-V compound semiconductor material, or a single crystalline II-VI compound semiconductor material. The raised source region 62 and the raised drain region 64 can be formed in epitaxial alignment of the underlying single crystalline lattice of the top semiconductor portion 30. The raised source region 62 and the raised drain region 64 include a semiconductor material that is lattice-matched with the semiconductor material of the top semiconductor portion 30. For example, the raised source region 62 and the raised drain region 64 can include any of single crystalline silicon, a single crystalline silicon-germanium alloy, a single crystalline silicon-carbon alloy, a single crystalline III-V compound semiconductor material, and a single crystalline II-VI compound semiconductor material, provided that lattice mismatch between the semiconductor material of the raised source region 62 and the raised drain region 64 and the semiconductor material of the top semiconductor portion 30 is small enough to enable selective epitaxy.

The raised source region 62 and the raised drain region 64 are doped with electrical dopant of p-type or n-type. The doping of the raised source region 62 and the raised drain region 64 can be performed during deposition of the raised source region 62 and the raised drain region 64 by in-situ doping, or can be performed by ion implantation after deposition of the raised source region 62 and the raised drain region 64. P-type electrical dopants include, for example, B, Ga, and In, and n-type dopants include, for example, P, As, and Sb. The raised source region 62 and the raised drain region 64 are located on opposite sides of the assembly of the gate stack (50, 52, 57) and the gate spacers 56. Electrical dopants can be introduced into the raised source region 62 and the raised drain region 64 during the selective deposition process by in-situ doping, or can be introduced into the raised source region 62 and the raised drain region 64 after selective epitaxy by ion implantation or plasma doping.

Figure 14:
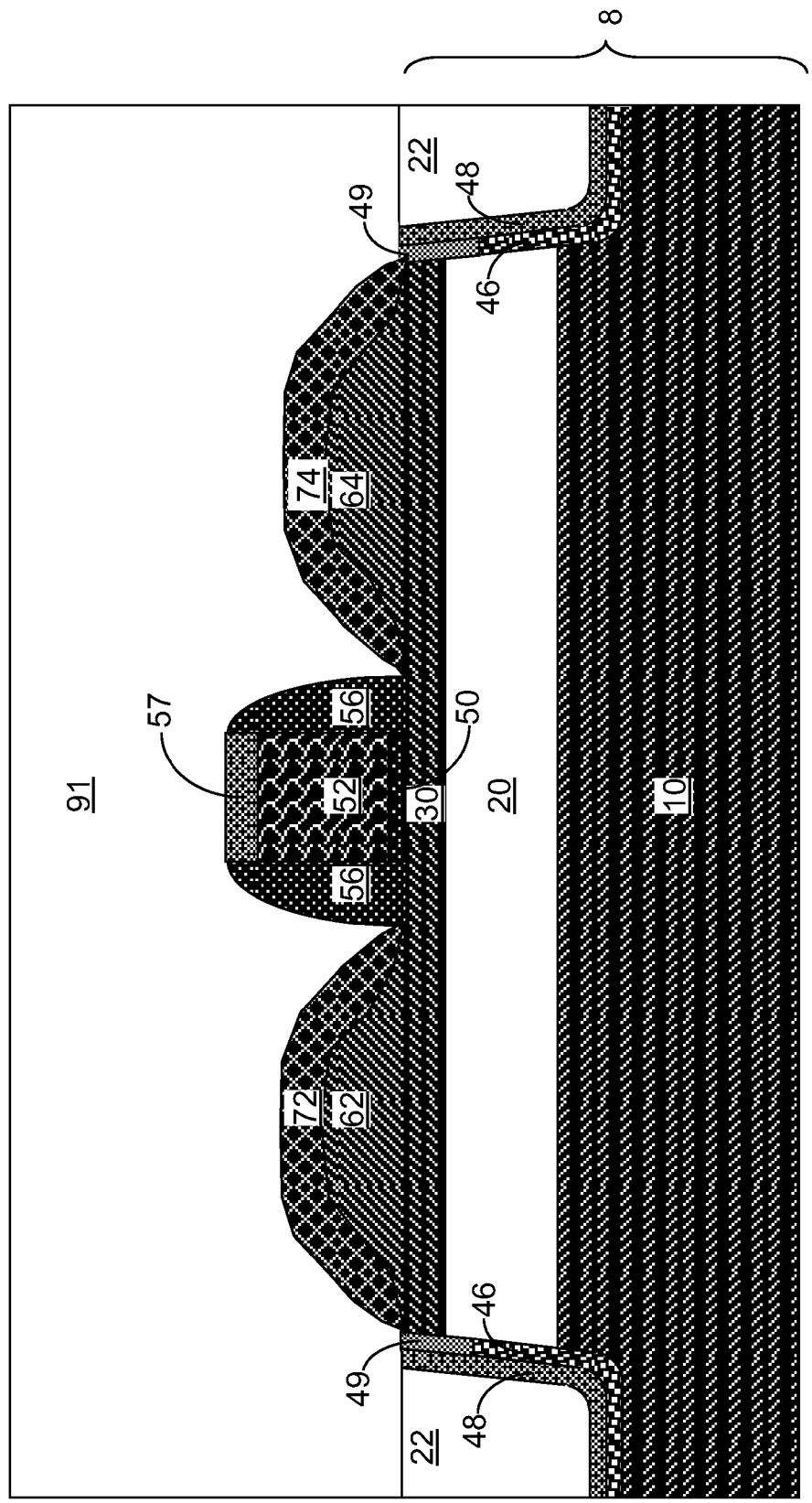
FIG. 14 is a vertical cross-sectional view of the first exemplary semiconductor structure after formation of source/drain metal semiconductor alloy portions and a contact-level dielectric material layer according to the first embodiment of the present disclosure.

Referring to FIG. 14, a source metal semiconductor alloy portion 72 and a drain metal semiconductor alloy portion 74 can be optionally formed, for example, by deposition of a metal layer on physically exposed surfaces of the raised source region 62 and the raised drain region 64. The source metal semiconductor alloy portion 72 and the drain metal semiconductor alloy portion 74 can include, for example, a metal silicide, a metal germanide, or any metallic compound that can be derived by reacting a metal with the semiconductor material of the raised source/drain regions (62, 64).

A contact-level dielectric material layer 91 is subsequently deposited over the entirety of the first exemplary semiconductor structure. The contact-level dielectric material layer 91 can include, for example, silicon oxide and/or porous or non-porous organosilicate glass (OSG). The contact-level dielectric material layer 91 can optionally include a silicon nitride layer that is vertically spaced from the source/drain metal semiconductor alloy portions (72, 74), the gate stack (50, 52, 57), the gate spacer 56, and the shallow trench fill portion 22. The contact-level dielectric material layer 91 can be formed, for example, by chemical vapor deposition (CVD) or spin-coating. The contact-level dielectric material layer 91 can be self-planarizing, or the top surface of the contact-level dielectric material layer 91 can be planarized, for example, by chemical mechanical planarization. The top surface of the contact-level dielectric material layer 91 is spaced from the top semiconductor portion 30 by a distance greater than the thickness of the gate stack (50, 52, 57).

Figure 15:
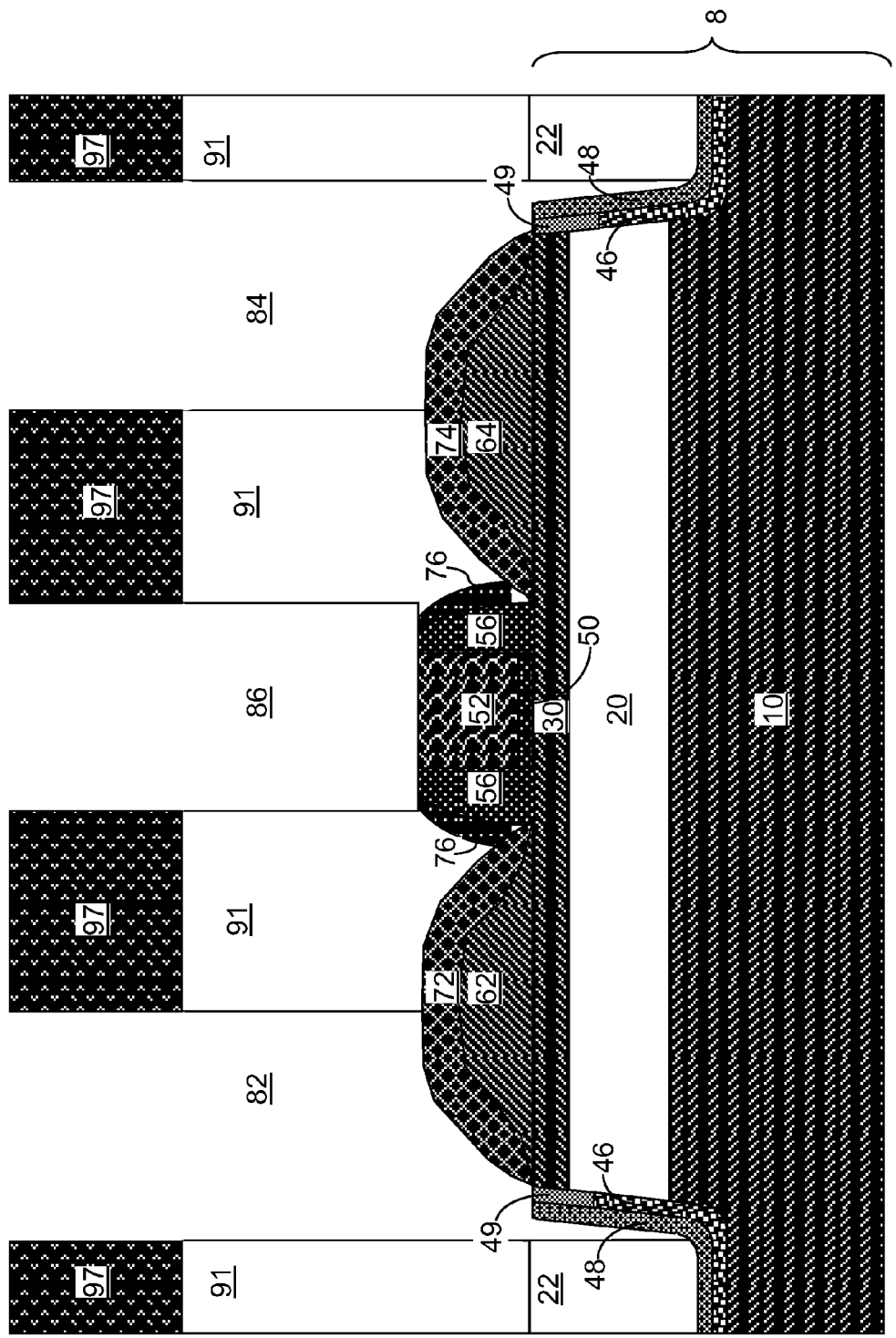
FIG. 15 is a vertical cross-sectional view of the first exemplary semiconductor structure after formation of various contact via holes according to the first embodiment of the present disclosure.

Referring to FIG. 15, a photoresist 97 is applied over the contact-level dielectric material layer 91, and is lithographically patterned to include various openings that overlie the raised source/drain regions (62, 64) and the gate stack (50, 52, 57). The pattern of the various openings in the photoresist 97 is transferred through the contact-level dielectric material layer 91 by an anisotropic etch that employs the photoresist 97 as an etch mask. The etch proceeds until the entire thickness of the contact-level dielectric material layer 91 is etched through underneath each opening in the photoresist 97, thereby forming various contact via holes. The various contact via holes can include, for example, a source-side contact via hole 82, a drain-side contact via hole 84, and a gate-side contact via hole 86.

In one embodiment, the etch can be non-selective to the material of the shallow trench fill portion 22. For example, if at least a lower portion of the contact-level dielectric material layer 91 includes silicon oxide and if the shallow trench fill portion 22 includes silicon oxide, the etch is not selective to the material of the shallow trench fill portion 22. In this case, a misalignment of an opening during lithographic exposure and development of the photoresist 97 can result in extension of the source-side contact via hole 82 and/or the drain-side contact via hole 84 below the top surface of the shallow trench fill portion 22. In some cases, the source-side contact via hole 82 and/or the drain-side contact via hole 84 can extend below the plane of the interface between the handle substrate 10 and the buried insulator portion 20.

In one embodiment, the etch of the contact via holes (82, 84, 86) can employ an etch chemistry that is selective to the materials of the silicon nitride liner 48 and the dielectric material portion 49. In this case, the silicon nitride liner 48 can be employed as a stopping layer during the etch. Further, the dielectric material portion 49 can also be employed as a stopping layer. For example, if at least a lower portion of the contact-level dielectric material layer 91 includes silicon oxide and if the shallow trench fill portion 22 includes silicon oxide, and if the dielectric material portion 49 includes silicon nitride, the etch chemistry can be selective to silicon nitride, i.e., does not etch silicon nitride. The photoresist 97 is subsequently removed, for example, by ashing.

Figure 16:
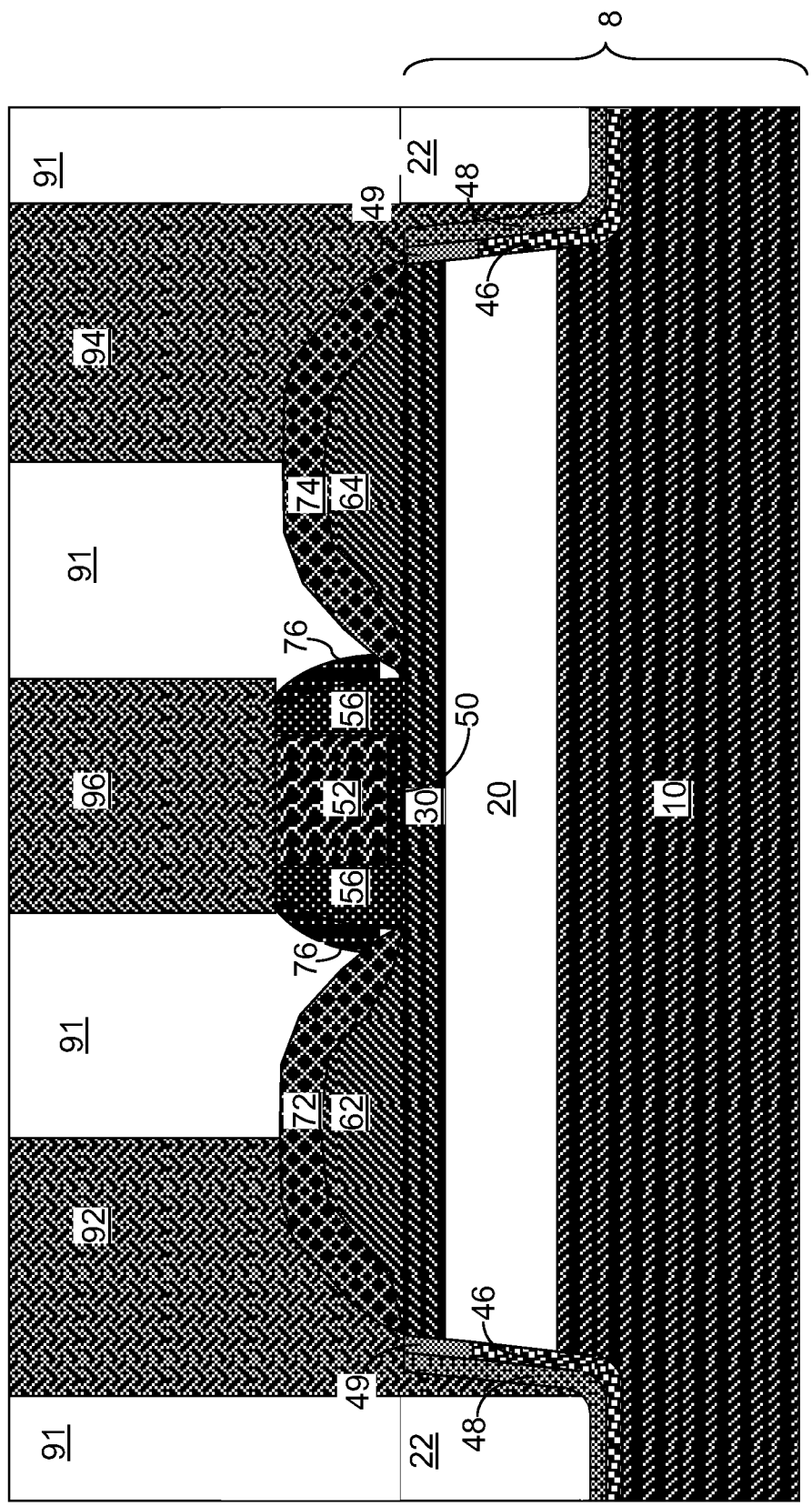
FIG. 16 is a vertical cross-sectional view of the first exemplary semiconductor structure after formation of various contact via structures according to the first embodiment of the present disclosure.

Referring to FIG. 16, various contact via structures are formed by filling the various contact via holes (82, 84, 86) with a conductive material. The conductive material can include, but are not limited to, W, Ti, Ta, Al, Cu, WN, TiN, TaN, WC, TiC, TaC, or any combination thereof. The conductive material is deposited within each contact via hole (82, 84, 86) and directly on the silicon nitride liner 48 and the dielectric material portion 49. The conductive material can be deposited, for example, by chemical vapor deposition (CVD), physical vapor deposition (PVD), electroplating, electroless plating, or any other known deposition methods known in the art. The excess conductive material deposited above the top surface of the contact-level dielectric material layer 91 can be removed, for example, by chemical mechanical planarization (CMP).

The various contact via structures can include, for example, a source-side contact via structure 92 that fills the source-side contact via hole 82, a drain-side contact via structure 94 that fills the drain-side contact via hole 84, and a gate-side contact via structure 96 that fills the gate-side contact via hole 82. A lower portion of the source-side contact via structure 92 and/or a lower portion of the drain-side contact via structure 94 can extend below the horizontal plane of the top surface of the top semiconductor portion 30. In one embodiment, the lower portion of the source-side contact via structure 92 and/or the lower portion of the drain-side contact via structure 94 can extend below the horizontal plane of the interface between the handle substrate 10 and the buried insulator portion 20. The lower portion of the source-side contact via structure 92 and/or the lower portion of the drain-side contact via structure 94 are/is laterally spaced from the top semiconductor portion 30 by the silicon nitride liner 48 and the dielectric material portion 49.

The first exemplary semiconductor structure of FIG. 16 includes a shallow trench laterally surrounding a stack of the top semiconductor portion 30, the buried insulator portion 20, and an upper portion of the handle substrate 10 and located in a semiconductor-on-insulator (SOI) substrate 8. The first exemplary semiconductor structure further includes a stack of the dielectric metal oxide liner 46 and a silicon nitride liner 48 located at a bottom of the shallow trench. A topmost portion of the dielectric metal oxide liner 46 laterally surrounds a lower portion of the buried insulator portion 20, is in contact with a sidewall of the lower portion of the buried insulator portion 20, and is located below the horizontal plane of the top surface of the buried insulator portion 20. The shallow trench fill portion 22 is located within the shallow trench and vertically contacts the stack of the dielectric metal oxide liner 46 and a silicon nitride liner 48. The contact-level dielectric layer 91 is located over the top semiconductor portion 30 and the shallow trench fill portion 22. A contact via structure, such as the source-side contact via structure 92 and/or the drain-side contact via structure 94, extends through the contact-level dielectric layer 91 and into a portion of the shallow trench. Each of the source-side contact via structure 92 and the drain-side contact via structure 94 is in contact with a vertical sidewall of the shallow trench fill portion 22 and the silicon nitride liner 48.

Figure 17:
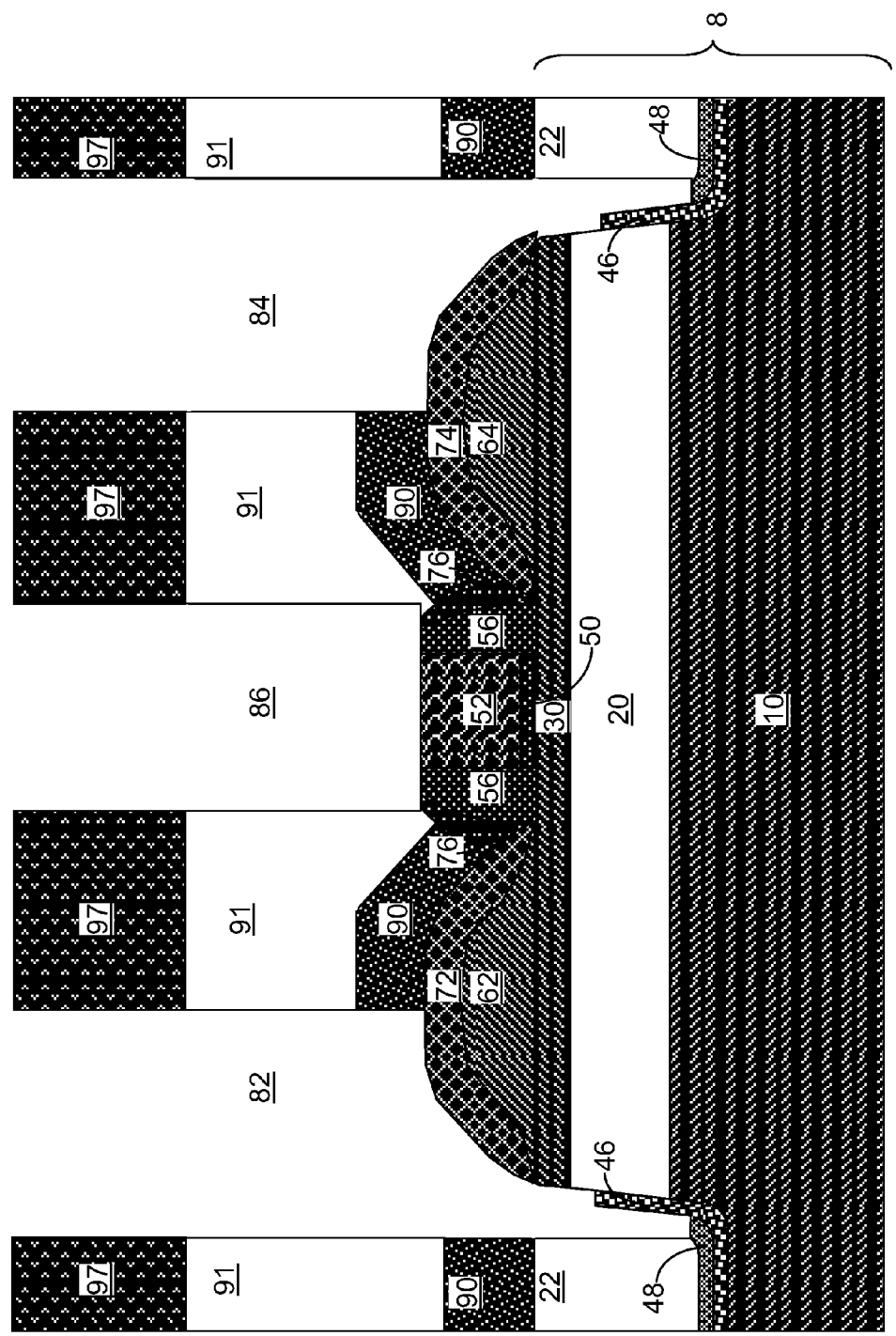
FIG. 17 is a vertical cross-sectional view of a second exemplary semiconductor structure after formation of various contact via holes according to a second embodiment of the present disclosure.

Referring to FIG. 17, a second exemplary semiconductor structure according to a second embodiment of the present disclosure can be derived from the first exemplary semiconductor structure of FIG. 15 by depositing a contact-level silicon nitride layer 90 as another contact-level dielectric material layer prior to depositing the contact-level dielectric material layer 91. In this case, the etch process employed to form the various contact via holes (82, 84, 86) includes a silicon nitride etch that transfers the pattern of the openings in the photoresist 97 through the contact-level silicon nitride liner 90.

The silicon nitride etch is not selective to the silicon nitride material of the silicon nitride liner 48, and consequently, the silicon nitride liner 48 can be recessed below the horizontal plane of the bottom surface of the top semiconductor portion 30, and in some cases, below the horizontal plane of the bottom surface of the buried insulator portion 20. Further, if the dielectric material portion 49 includes silicon nitride, the dielectric material portion 49 can be removed during the silicon nitride etch. In this case, an etch chemistry that is selective to the material of the dielectric metal oxide liner 46 is selected for the silicon nitride etch, and correspondingly, the dielectric metal oxide liner 46 is employed as an etch stop layer, i.e., a stopping layer, during the etch of the contact-level silicon nitride layer 90.

Figure 18:
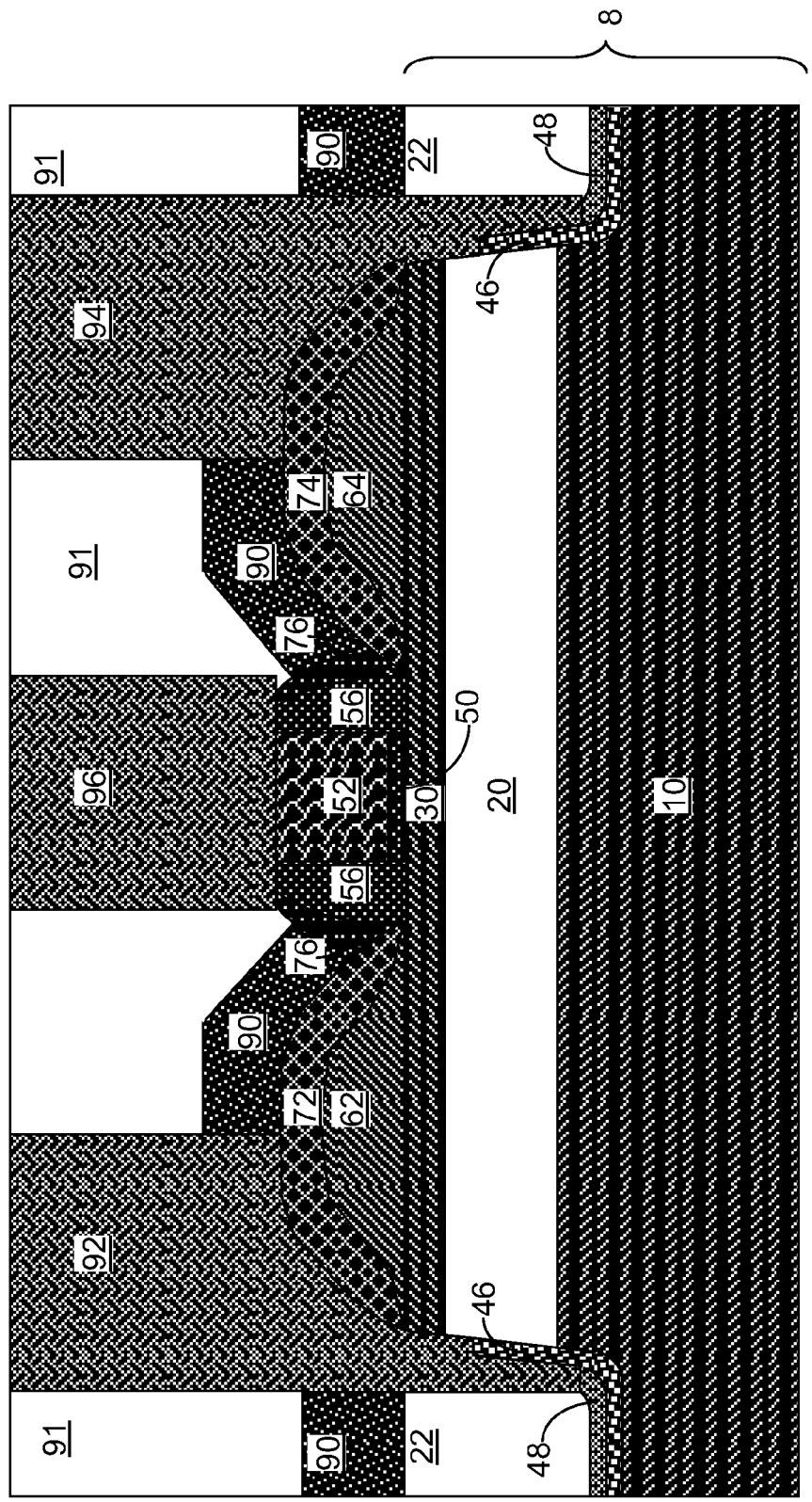
FIG. 18 is a vertical cross-sectional view of the second exemplary semiconductor structure after formation of various contact via structures according to the second embodiment of the present disclosure.

Referring to FIG. 18, the processing steps of FIG. 16 are performed in the same manner as in the first embodiment. Specifically, the source-side contact via structure 92 and the drain-side contact via structure 94 are formed by depositing a conductive material directly on a sidewall surface of the top semiconductor portion 30 and a sidewall surface of an upper portion of the buried insulator portion 20 and within the corresponding contact via hole (82, 84). The conductive material is deposited directly on the silicon nitride liner 48 and the dielectric metal oxide liner 46.

The second exemplary semiconductor structure of FIG. 18 includes a shallow trench laterally surrounding a stack of the top semiconductor portion 30, the buried insulator portion 20, and an upper portion of the handle substrate 10 and located in a semiconductor-on-insulator (SOI) substrate 8. The second exemplary semiconductor structure further includes a stack of the dielectric metal oxide liner 46 and a silicon nitride liner 48 located at a bottom of the shallow trench. A topmost portion of the dielectric metal oxide liner 46 laterally surrounds a lower portion of the buried insulator portion 20, is in contact with a sidewall of the lower portion of the buried insulator portion 20, and is located below the horizontal plane of the top surface of the buried insulator portion 20. The shallow trench fill portion 22 is located within the shallow trench and vertically contacts the stack of the dielectric metal oxide liner 46 and a silicon nitride liner 48. The contact-level dielectric layer 91 is located over the top semiconductor portion 30 and the shallow trench fill portion 22. A contact via structure, such as the source-side contact via structure 92 and/or the drain-side contact via structure 94, extends through the contact-level dielectric layer 91 and into a portion of the shallow trench. Each of the source-side contact via structure 92 and the drain-side contact via structure 94 is in contact with a vertical sidewall of the shallow trench fill portion 22, a sidewall surface of the top semiconductor portion 30, and a sidewall surface of an upper portion of the buried insulator portion 20.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of forming a semiconductor structure comprising:
    etching a shallow trench laterally surrounding a stack of a top semiconductor portion, a buried insulator portion, and an upper portion of a handle substrate in a semiconductor-on-insulator (SOI) substrate;
    depositing a stack of a dielectric metal oxide liner and a silicon nitride liner in said shallow trench;
    filling said shallow trench with a shallow trench fill portion;
    recessing said dielectric metal oxide liner to a depth below the horizontal plane of a bottom surface of said top semiconductor portion, wherein a divot laterally surrounding said top semiconductor portion is formed by said recessing;
    depositing a contact-level dielectric layer over said top semiconductor portion and said shallow trench fill portion;
    etching a contact via hole through said contact-level dielectric layer and a portion of said shallow trench fill portion employing at least one of said dielectric metal oxide liner and said silicon nitride liner as a stopping layer; and
    forming a contact via structure by depositing a conductive material within said contact via hole, wherein a portion of said contact via structure is formed directly on a vertical sidewall surface of said top semiconductor portion.

2. The method of claim 1, wherein a portion of said contact via structure is in direct contact with a topmost horizontal surface of said dielectric metal oxide liner and a topmost surface of said silicon nitride liner.

3. The method of claim 1, wherein said dielectric metal oxide liner is recessed to a depth between a top surface of said buried insulator portion and a bottom surface of said buried insulator portion.

4. The method of claim 3, wherein another portion of said contact via structure is formed directly on a vertical sidewall surface of said buried insulator portion.

5. The method of claim 1, further comprising recessing said silicon nitride liner to a depth below the horizontal plane of a bottom surface of said top semiconductor portion.

6. The method of claim 5, wherein said silicon nitride liner is recessed to a depth below the horizontal plane of a bottom surface of said buried insulator portion.

7. The method of claim 6, wherein said contact via structure is in direct contact with a vertical sidewall of said dielectric metal oxide liner and a topmost surface of said silicon nitride liner.

8. The method of claim 7, wherein a portion of said contact via structure is in direct contact with a vertical sidewall surface of said shallow trench fill portion.

9. The method of claim 8, wherein said shallow trench fill portion located within said shallow trench contacts said silicon nitride liner.

10. The method of claim 1, further comprising forming a contact-level nitride layer on said shallow trench fill portion.

11. The method of claim 10, wherein said contact-level nitride layer is in direct contact with a topmost surface of said shallow trench fill portion and a bottommost surface of said contact-level dielectric layer.

12. The method of claim 1, wherein said stack of said dielectric metal oxide liner and said silicon nitride liner are deposited as contiguous layers above a topmost surface of said stack of said top semiconductor portion, said buried insulator portion, and said upper portion of a handle substrate in a semiconductor-on-insulator (SOI) substrate.

13. The method of claim 12, further comprising:
    removing said stack of said dielectric metal oxide liner and said silicon nitride liner from above said top semiconductor portion; and
    forming a gate stack including a gate dielectric after said removal of said stack from above said top semiconductor portion.

14. The method of claim 13, further comprising forming a gate spacer on said gate stack.

15. The method of claim 1, further comprising forming a raised source region and a raised drain region on said top semiconductor portion.

16. The method of claim 15, wherein said raised source region and said raised drain region comprise a doped semiconductor material.

17. The method of claim 1, wherein said dielectric metal oxide liner comprises a nitrogen, carbon, fluorine or chlorine.

18. The method of claim 1, wherein a topmost surface of said shallow trench fill portion is located above a topmost surface of said top semiconductor portion.

* * * * *